United States Patent [19]

Ragle et al.

[11] Patent Number: 4,864,119
[45] Date of Patent: Sep. 5, 1989

[54] BULK AVALANCHE SEMICONDUCTOR SWITCH USING A MESA STRUCTURE

[75] Inventors: Larry O. Ragle, Palo Alto; Stephen J. Davis, San Francisco; Richard A. Williams, Palo Alto, all of Calif.

[73] Assignee: Power Spectra, Inc., Fremont, Calif.

[21] Appl. No.: 92,745

[22] Filed: Sep. 3, 1987

[51] Int. Cl.$^4$ ............................................. H01J 40/14
[52] U.S. Cl. ................................................. 250/211 R
[58] Field of Search ......................... 250/211 J, 211 R; 357/30 A, 30 D, 56

[56] References Cited

U.S. PATENT DOCUMENTS

| 2,629,800 | 2/1953 | Pearson | 255/211 J |
| 3,448,351 | 6/1969 | Baertsch | 357/30 |

Primary Examiner—David C. Nelms
Assistant Examiner—Eric F. Chatmon
Attorney, Agent, or Firm—Townsend and Townsend

[57] ABSTRACT

A switch using an improved method of optically-triggered avalanche breakdown which can produce pulses of 100 picoseconds or longer duration that can deliver five kilovolts into 50 ohms using a standard laser diode. A semiconductor block is provided with contacts on opposing sides across which a high-voltage less than the avalanche breakdown voltage is applied. One of the electrodes is on a mesa on one side of the block. The mesa is then irradiated with electromagnetic radiation. The wavelength of the radiation and the absorption coefficient of the semiconductor block are chosen so that the absorption depth of the majority of the radiation is less than the distance between the contacts. This results in a conduction area where absorption occurs, thus applying most of the high voltage across the distance beyond where the radiation is absorbed. This provides field compression and generates an avalanche breakdown field across the remaining distance of the semiconductor block.

14 Claims, 4 Drawing Sheets

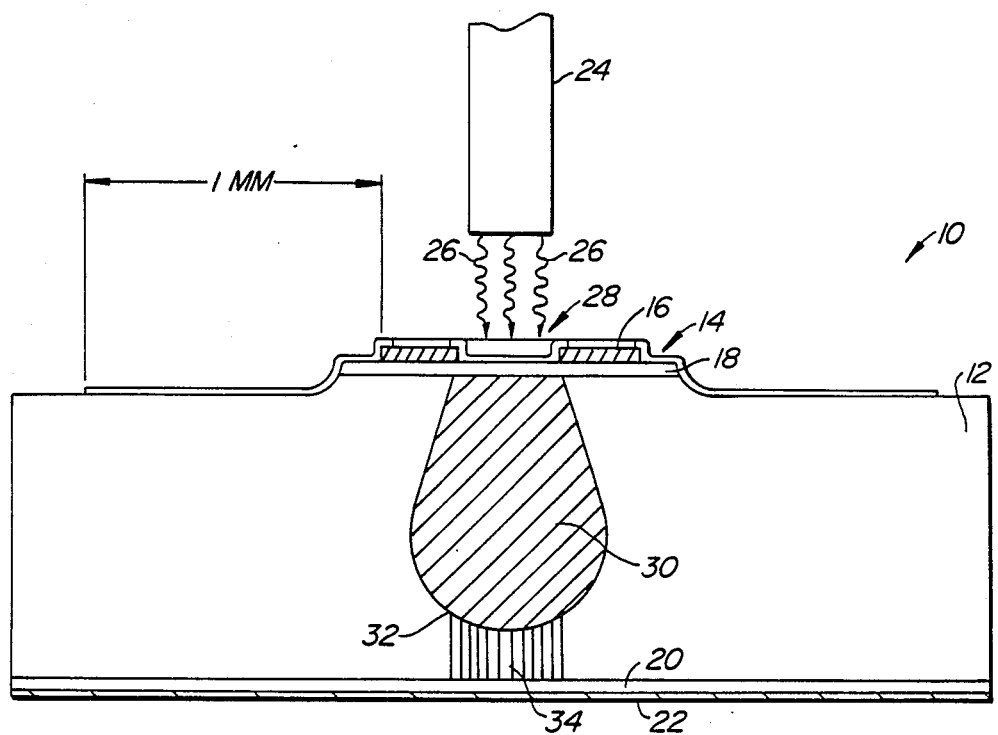
FIG._1.

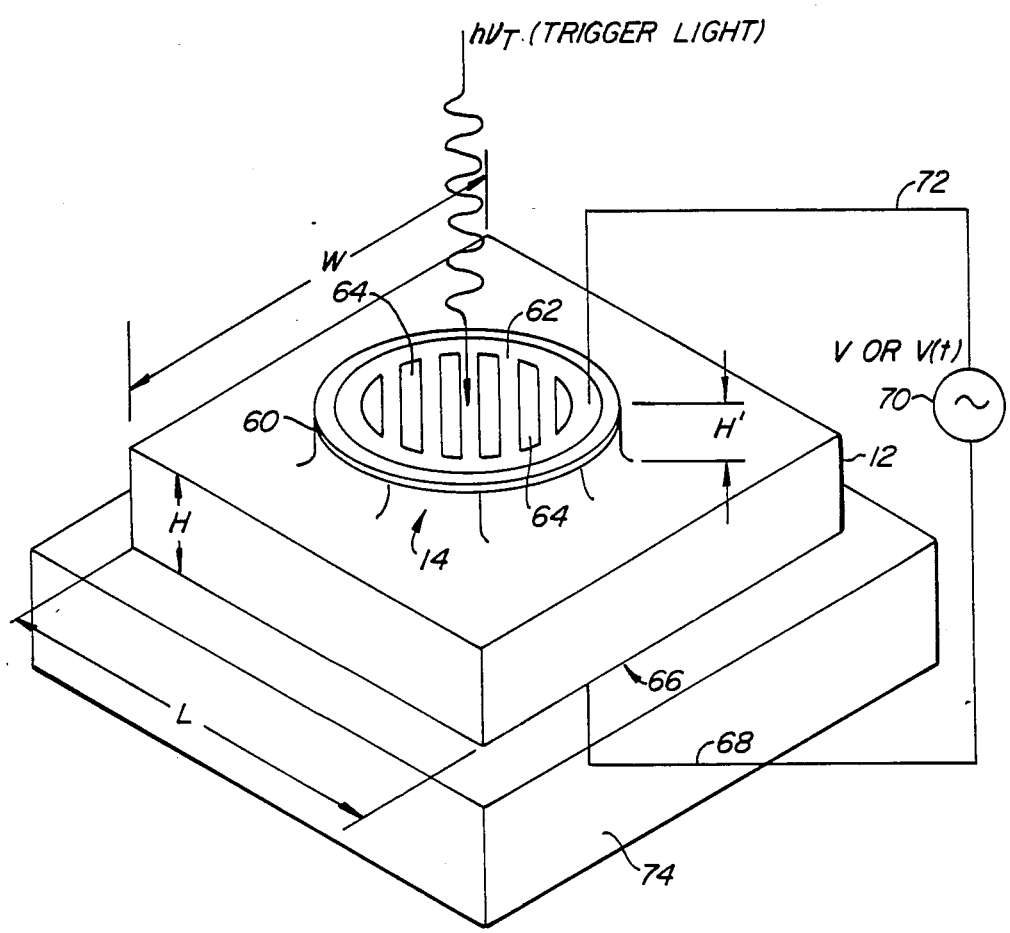
FIG._2.

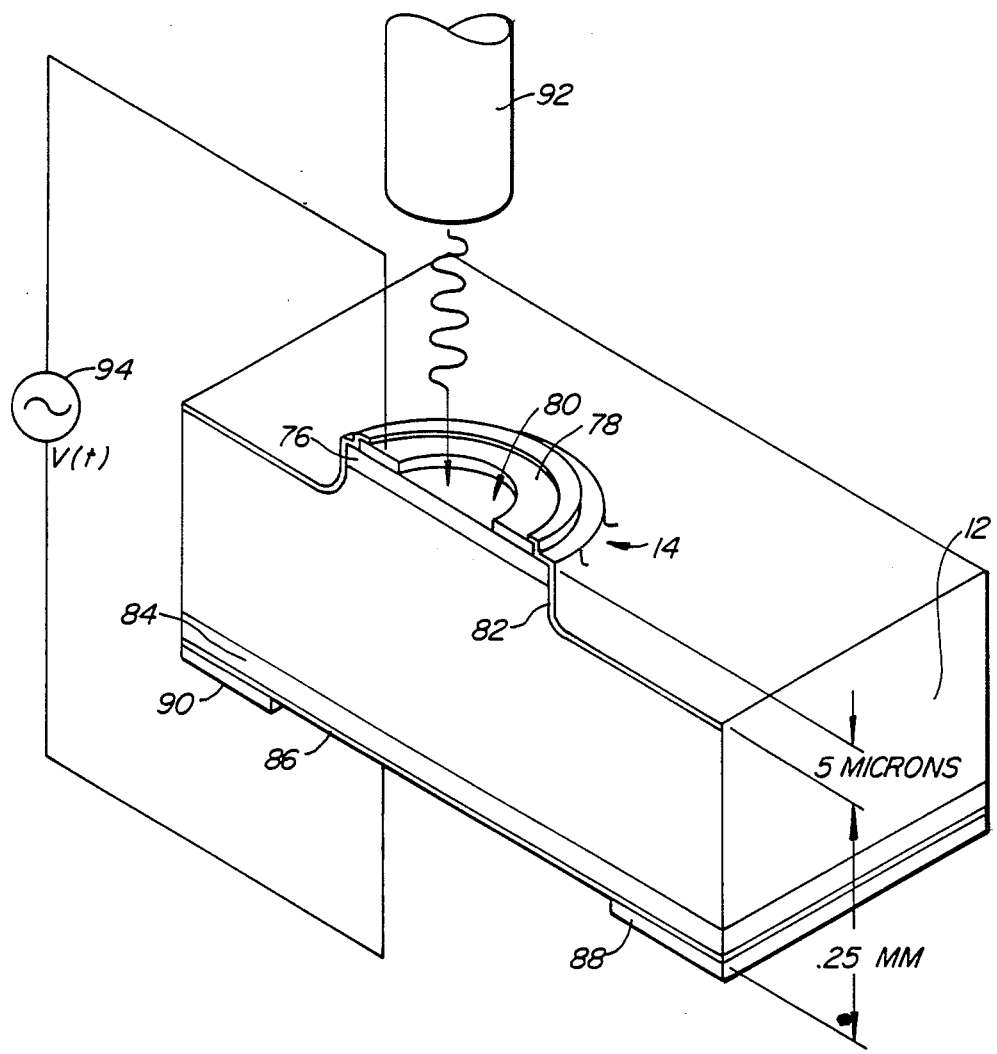
FIG._3.

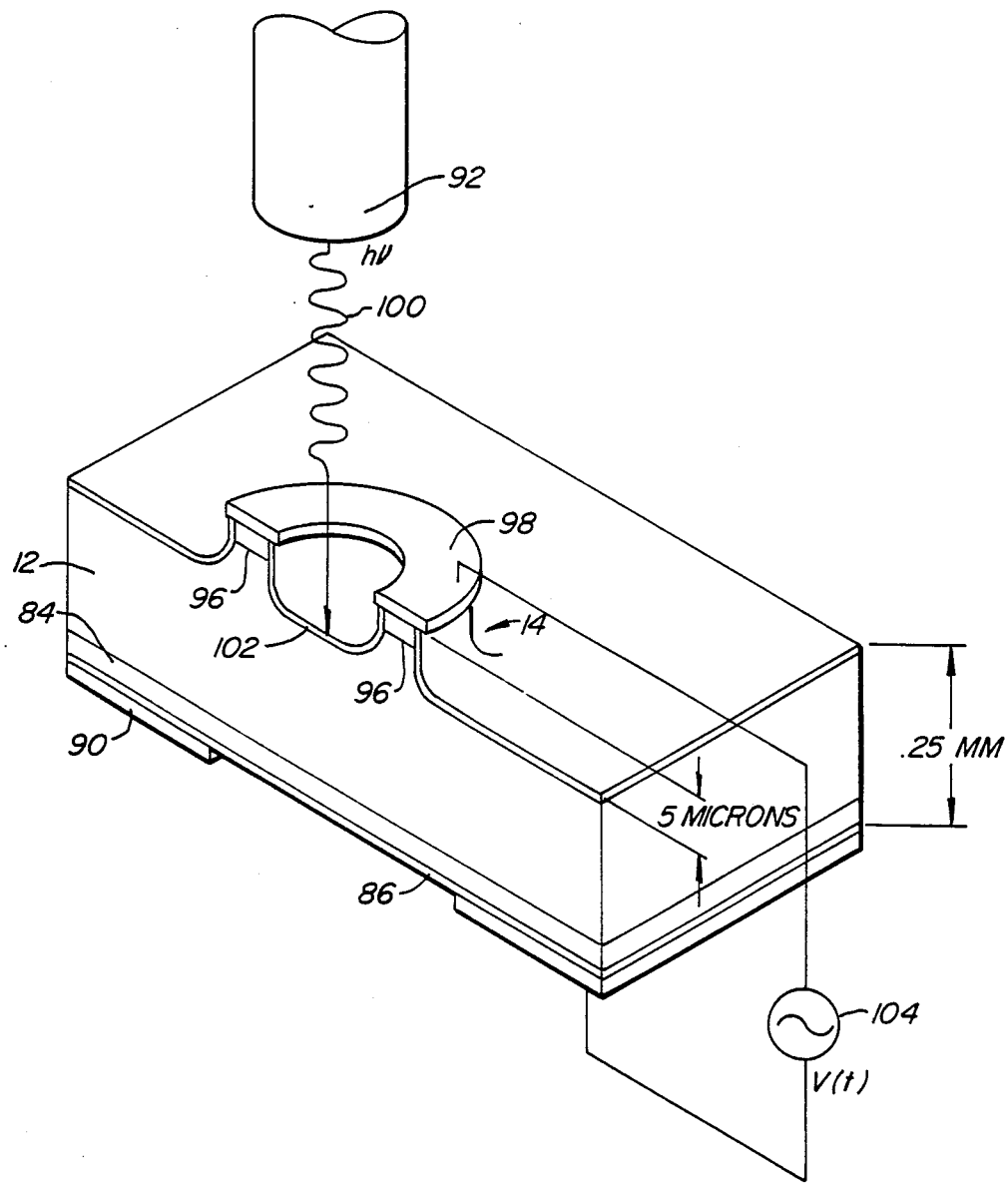
FIG._4.

BULK AVALANCHE SEMICONDUCTOR SWITCH USING A MESA STRUCTURE

This invention was made with Government support under Contract No. N00014-86-0865 awarded by the Department of the Navy.

A related application is entitled "Bulk Avalanche Semiconductor Switch Using Field Compression," Ser. No. 92,487, filed concurrently herewith now U.S. Pat. No. 4,782,222.

BACKGROUND

The present invention relates to the switching of electric power through avalanche action throughout the volume of a block of semiconductor material.

One method of switching electrical current is to provide two contacts to a block of semiconductor material. The semiconductor material is doped so that it acts as an insulator. When light from a laser is directed on the semiconductor material, photoconduction occurs which causes the semiconductor block to conduct. Typically, a powerful desk top laser is required to generate the required amount of photoconduction for significant amounts of current. A discussion of switches of this type is contained in Davis U.S. Pat. No. 4,438,331.

An alternate method using avalanche breakdown is discussed in Mourou U.S. Pat. No. 4,347,437. Mourou applies a high voltage across the semiconductor material which is less than the voltage which would cause avalanche breakdown. Avalanche breakdown occurs when the charge carriers (i.e., electrons and holes) have sufficient kinetic energy due to the applied field, so that when they collide with an atom, they knock loose one electron-hole pair, which in turn creates further electron-hole pairs, thereby creating an exponentially increasing current flow. Mourou uses the high voltage to bias the semiconductor material below the voltage required for avalanche breakdown. A laser is then used to generate photoconductors which cause conduction to occur. This builds to avalanche conduction over a period of a few hundred picoseconds to more than one nanosecond.

Although Mourou does not set forth the details of the avalanche breakdown, it is believed the avalanche in his device proceeds with the creation of one or more "streamers" of conduction through the semiconductor material between the contacts, with the streamers increasing in diameter until the entire semiconductor is conducting. A streamer is a thin line of conduction between the contacts which may start at microscopic irregularities of the contact or the semiconducting material. The creation of such streamers would limit the useful life of the switches because of the high stress placed on the areas in which the streamers first occur.

The Mourou device requires that the semiconductor material is cooled to a cryogenic temperature to prevent thermally-induced carriers from starting conduction when the voltage is applied and before the laser is turned on. Mourou states that a laser diode with 3 nanojoules produces a megawatt of power using this method.

SUMMARY OF THE INVENTION

The present invention is a switch using an improved method of optically-triggered avalanche breakdown which produce pulses of 100 picoseconds duration or more and that can deliver five kilovolts or more with a rise time of substantially 50 picoseconds or less into 50 ohms using a standard laser diode. A semiconductor block is provided with contacts on opposing sides across which a high-voltage less than the instantaneous avalanche breakdown voltage is applied. One of the electrodes is on a mesa on one side of the block. The mesa is then irradiated with electromagnetic radiation. The wavelength of the radiation and the absorption depth coefficient of the semiconductor block are chosen so that the absorption depth of the majority of the radiation is less than the distance between the contacts. After triggering, this results in a conduction area where absorption occurs, thus applying the entire high voltage across the distance beyond where the radiation is absorbed. This provides significant field compression and generates an avalanche breakdown field across the remaining distance of the semiconductor block.

The mesa area is a circular or ovoid region in the middle of the larger rectangular block. Light is directed onto the mesa area which causes current through the block rather than along the surface. In addition, such a mesa is simple to make through simple etching techniques. The block is wide compared to the size of the mesa to prevent voltage flash-over around the surface of the block between the electrodes. This surface breakdown effect can further be reduced by using a passivation layer of insulating material, such as polyimide or silicon nitride, to cover the block. An N+ layer is used beneath each of the metal electrodes to make low resistance contacts and to prevent metal migration. The block itself is preferably made of lightly doped or semi-insulating N-type gallium arsenide (GaAs).

The photoconductive avalanche semiconductor switch (PASS) device of the present invention is a light-activated switch which is designed to operate in a mixed photoconductive-avalanche mode. A semiconductor diode injection laser is used to generate a sufficient light flux to create a photoconductive region with a electron-hole density of substantially $10^{16}/cm^3$ or more near the surface from which the light enters. The wavelength of light used to create this photoconductive region is chosen such that the light absorption depth is some major fraction of the interelectrode spacing. Immediately after creation of this photoconductive region, the electric field in the PASS device is intensified near the electrode which is located on the opposite side from where the light enters. Avalanche carrier generation will ensue for approximately one nanosecond if the electric field and background carrier levels in this avalanche region are sufficiently high. Typically, the field value must be on the order of $2 \times 10^5$ volts/cm or higher for strong avalanche generation to occur.

The PASS device differs importantly in design as well as in operation from the purely avalanche device described by Gerard Mourou in U.S. Pat. No. 4,347,347. The principal design differences reside in the laser drive wavelength and intensity chosen. The PASS device utilizes a drive with a wavelength chosen (typically 0.7 to 0.9 microns for gallium arsenide) to give an absorption on depth substantially less than the interelectrode spacing, whereas in the avalanche device the wavelength (typically 1.06 to 10 microns for gallium arsenide) is chosen to penetrate quite uniformly throughout the device between the two electrodes. In addition, the PASS device uses a laser intensity and pulse length sufficient to give a strongly photoconductive region in the body of the device, whereas in the avalanche device the opposite is true. In the Mourou patent, carriers are implanted or seeded only to trigger avalanche conduction through the bulk of the body between the electrodes and the triggering laser energy level is much less than that needed for photoconduction through the body.

Operationally, the PASS device of the present invention uses photoconduction in one region and avalanche generation in a second region to create the electron-hole pairs. The two regions are electrically in a series connection with relation to each other. The creation of these two regions is separated in time by about one nanosecond. In contrast, in a pure avalanche device there is but a single avalanche region created throughout the body at a single time.

In general, the PASS device may switch with a lower level of triggering light flux (which, however, is concentrated in one region) and at a lower applied bias voltage than a device which is designed to operate solely in an avalanche mode. In addition, the PASS device may switch more quickly and with less jitter than a switch which has been designed to operate solely in the avalanche mode.

The field compression effect results in a high, relatively uniform field and uniform photogeneration of "seed" carriers in the avalanche region, eliminating streamers. The device has a turn-on rise time of approximately 50 picoseconds, due to the nature of the avalanche process. In addition, the lifetime of the device is much greater than the devices of the prior art. The field compression and avalanche mechanism permit the device to be triggered to the ON state with a conventional injection laser diode. Also, a high resistivity or semi-insulating semiconductor block can be used, thus eliminating the need for cryogenic cooling and allowing the device to operate at room temperature. The block itself is preferably made of semi-insulating gallium arsenide (GaAs).

For a fuller understanding of the nature and advantages of the invention, reference should be made to the ensuing detailed description taken in conjunction with the accompanying drawings.

BRIEF DESCRIPTION OF THE DRAWINGS

FIG. 1 is a cross-sectional diagram of a switch according to the present invention showing the mesa structure and the field compression effect;

FIG. 2 is a perspective view of an embodiment of a semiconductor switch according to the present invention using a grid electrode on a mesa;

FIG. 3 is a cross-sectional perspective view of a switch according to the present invention using a ring electrode structure; and FIG. 4 is a cross-sectional perspective view of an embodiment with an annular mesa structure.

DETAILED DESCRIPTION OF THE PREFERRED EMBODIMENTS

FIG. 1 is a graphic sectional view of a semiconductor switch 10 according to the present invention showing the field compression. A rectangular block 12 of semiconductor material, preferably N-type GaAs with a resistivity greater than $10^7$ ohm-cm is provided with a circular mesa structure 14 (as shown in perspective view in FIG. 2). Mesa 14 has a metal ring contact 16 on top of a N+ circular layer 18. The bottom of semiconductor block 12 is provided with an N+ layer 20 and a metal electrode 22. The N+ layers provide low contact resistance and reduce metal migration into the block. The highly doped N+ regions also promote uniform conduction through the semiconductor block.

A high voltage is applied across electrodes 16 and 22 to present an electric field across block 12 which is less than the instantaneous avalanche breakdown value. Light from a laser diode (not shown) is passed through a fiber-optic cable 24 and directed as indicated by light rays 26 onto the central area 28 of mesa 14. This light will be absorbed in a region 30 which is less than the distance between electrodes 16 and 22. This region 30 will have photo-generated charge carriers which act to effectively reduce the electric field from being between N+ regions 18 and 20 to being between a bottom edge 32 of absorption region 30 and N+ region 20. This shorter distance makes the electric field created by the same voltage high enough to cause avalanche breakdown which causes a conduction plasma 34 to conduct between the charge carriers of absorption region 30 and N+ region 20.

A PASS device preferably operates with as little light input flux as necessary to achieve the desired level of conductivity in the "ON" state, so that the laser diode drive requirements can be as modest as possible. A device with approximately a 0.16 mm² "active" area and in which the spacing between electrodes is 0.5 mm and a bias of 5,000 volts requires a light flux of about 20 to 200 nj for high conductivity in the "ON" state. One way to reduce the light flux needed is to increase the bias voltage across the PASS device with a given inter-electrode spacing. This higher bias voltage results in a higher field within the device. Since a smaller volume of the PASS device needs to be made photoconductive to achieve a given field level in the avalanche region after the laser trigger pulse illuminates the device, higher initial bias voltages are highly desirable. In the prior art relating to light-activated avalanche switches, electric field concentrations occur at and near the edges of the electrodes which limit the bias voltage which can be impressed across the device.

Avalanche triggering will occur when the following approximate expression reaches a sufficiently large value:

$$G = a_1 N E \exp(-a_2/E^{a_3}) \quad \text{(eq. 1)}$$

where G is avalanche generation rate, E is electric field strength, N is charge carrier density and $a_1$, $a_2$ and $a_3$ are constants peculiar to a given material. Avalanche generation then occurs when the photogenerated carrier density and the electric field strength are sufficiently high.

When the photon energy $h\nu_T$ is made approximately equal to the energy gap $E_g$ of the semiconductor block, the photon absorption depth is made less than, but a substantial fraction of, the thickness of the semiconductor block. Alternatively, one can vary the gap energy $E_g$ to obtain, within limits, a desired effective absorption length for a fixed photon energy, by applying stress to or changing the temperature of the block. Generally, an increase in temperature or application of uniaxial compression should decrease the gap energy. As $E_g$ decreases relative to $h\nu_T$, the absorption depth also decreases.

The turn-off of the PASS device will often be accomplished by means external to the PASS itself, such as by the use of pulse forming network drive lines. In some applications it is convenient to employ self turn-off of the PASS device. For rapid self turn-off, it is necessary that the recombination time be rapid since the self turn-off time will be that of the recombination time in the absence of latch-up. Latch-up is avoided in general by making the recombination time short relative to the charge carrier transit time. The transit time is defined as the time required for charge carriers to traverse the interelectrode spacing.

During the self turn-off time the electron-hole pairs will recombine, taking away the charge carriers which are necessary for conduction. To promote rapid turn-off of the PASS device, the semiconductor semi-insulating or lightly doped N region can be doped with trapping levels. An example is the doping of semi-insulating gallium arsenide with chromium or oxygen to a density of at least $10^{15}/cm^3$.

The intensity I (or photon flux) of monochromatic light at a given depth d is given by the equation:

$$I = I_o e^{-\alpha d} \quad \text{(eq. 2)}$$

where:

$\alpha$ = absorption coefficient of semiconductor;
d = depth;
I = intensity at d; and
$I_o$ = initial intensity.

One can tell by looking at equation 2 that if the intensity of the light source is reduced or if the absorption coefficient is increased, the intensity at a particular depth will decrease and thus the depth of conduction region 30 will decrease. Since the absorption characteristic of a semiconductor material is proportional to the wavelength o the light, a smaller absorption characteristic requires shorter wavelengths. One method for allowing the use of longer wavelength light or for using lower intensity (i.e., lower power) lasers is shown in FIG. 2.

Preferably, block 12 is N-type GaAs having a resistivity greater than $10^6$ ohm-cm to allow room temperature operation without thermal carriers causing thermal runaway. With a 5 kV bias and a 1 mm diameter area, this resistivity results in a leakage of less than 400 mW. The voltage applied across the electrodes of a block of width 0.5 mm can be up to 5kV or higher. Although this is one preferred embodiment, a range of choices of wavelength, doping concentration, voltages, etc. will work.

The top and bottom electrodes each provide ohmic contacts, with a static or time-varying electrical field of the order of E=20,000- 200,000 kV/cm being imposed between the two electrodes. At a predetermined time, a trigger pulse $h\nu_T$ of electromagnetic radiation of wavelength $\lambda_T = c/\nu_T \sim 860$-910 nm (nanometers) propagates toward block 12, is partially transmitted into and through the block, and initiates electrical breakdown by avalanche in the bulk or volume of the block. A current then flows between the two electrodes.

In the case of III-V or II-V semiconductor materials, the associated trigger pulse energy $h\nu_T$ is preferably chosen to be approximately equal to the lowest bandgap energy $E_g$ associated with an actual valence-conduction transition for an electron. This choice should provide the most efficient absorption of photons from the laser while allowing an adequate energy difference to provide a large number of available conduction band transition sites. If the energy $h\nu_T$ is chosen too close to the actual energy bandgap $E_g$, the Pauli exclusion principle will severely limit the number of transition states available. Other energy levels, such as those from trapping levels, may exist to assist the photoelectron-hole creation process, and will alter slightly the absorption depth coefficient, and therefore, the choice of wavelength.

The GaAs material should preferably have a resistivity of $10^6$ ohm-centimeters or higher. For examples, such material is available from M/A-COM, Gallium Arsenide Products, Inc. or Spectrum Technology, Inc. in Czochralski-grown, semi-insulating blocks. Orientation of the GaAs crystal is also important, because the electron ionization rate is significantly higher perpendicular to a (100) plane than it is perpendicular to a (111) plane. High electron ionization rates produce higher switching sensitivity (switched current times switched voltage divided by radiation energy received).

Other semiconductor materials may be used rather than GaAs, and this choice will affect the irradiation wavelength $\lambda_T$ used for illumination. Some attractive choices of high mobility semiconductor material are shown in Table I.

TABLE I

| Semiconductor Materials & Mobilities. | |
|---|---|
| Material | Mobility (cm$^2$/volt-sec) |
| C | 1,800 |
| GaAs$_{1-x}$P$_x$ | |
| CdTe | 1,050 |
| GaAs | 8,500 |
| InP | 4,600 |
| Si | 1,500 |
| GaSb | 5,000 |
| Ge | 3,600 |
| InAs | 30,000 |
| ImP$_x$As$_{1-x}$ | |
| InSb | 80,000 |
| PbTe | 6,000 |
| PbSe | 1,000 |

For rapidly pulsed, repetitive operation or long pulse lengths, one may provide a heat sink material contiguous to the semiconductor block in any of the embodiments of the invention, to efficiently carry away the heat produced by dissipation of energy within the block. The heat sink material may be a substantially solid block of a high thermal conductivity material such as beryllia, copper, aluminum, tungsten, titanium, molybdenum or diamond; or it may be a liquid such as a fluorocarbon that is in contact with and flowing past one or more surfaces of the semiconductor block.

For the illumination source, for example, one may use a 500 watt laser diode array, such as is available from Laser Diode, Model 391, or as a single 15 watt laser diode, Laser Diode Model MH67, with output fed by optical fibers or rods or other means of delivery to the GaAs block. Due to the dielectric mismatch of GaAs and air, in the absence of antireflection coatings only about 70 percent of the radiation incident upon the GaAs surface is transmitted; the remaining 30 percent is reflected. Therefore, the use of anti-reflection coatings adjacent to the irradiated GaAs surface(s) may be appropriate to increase the absorption of the initiating radiation.

FIG. 2 shows a perspective view of one embodiment of a semiconductor switch according to the present invention. Semiconductor block 12 is rectangular in shape and has a contiguous mesa area 14 on its top surface. Block 12 is preferably N-type GaAs of thickness H=0.01mm-1cm. The height H' of mesa 14 is preferably 0.5-50 microns. A thin layer of N+ material 60 on top of mesa 14 has a width of 0.1-5 microns. On top of N+ layer 60 is a metal grid electrode 62 with a series of gaps 64 to allow light to pass through. A bottom surface 66 of block 12 is covered with a metal electrode and is coupled via an electrical line 68 to a high voltage source 70. The other side of high voltage source 70 is coupled via an electrical connection 72 to electrode 62. Optionally, block 12 is mounted on a heat sink 74.

In one embodiment, block 12 has a height H=0.5 mm, width W=4 mm and a length L=4 mm and mesa 14 has a diameter of 1 mm. This provides that the distance along the surface from electrode 62 to electrode 66 is at least 4 x the height of block 12, thus reducing the chances of the surface breakdown.

Mesa 14 can be either circular or ovoid in shape. This shape conforms to the normal shape of a beam of light from a laser diode through an optic fiber. The mesa is simply constructed by etching away the material around the mesa.

FIG. 3 shows a cross-sectional perspective view of an alternate embodiment of a semiconductor switch using a ring electrode. Block 12 is topped with a mesa structure 14 composed of a circular N+ layer 76 topped by a ring electrode 78. Light is allowed to pass through a center portion 80 of ring 78. In order to further reduce surface breakdown, a passivation layer of insulating material 82 (such as polyimide or silicon nitride) is applied to the top of block 12 and mesa 14 up to and over the edges of electrode ring 78. Optionally, no passivation layer is needed in the center of metal ring 78 because N+ layer 76 is a conducting path and no lateral field arises. The bottom of block 12 is covered with a layer of N+ material 84 which in turn is covered with a metal electrode layer 86. Optional passivation layers 88 and 90 can cover electrode 86 near the edges of block 12 and may also cover the sides of block 12 (not shown).

Electrodes 78 and 86, N+ layers 76 and 84 and passivation layers 82, 88 and 90 each have thicknesses on the order of $0.1 \propto 20$ microns. The inner and outer diameters of electrode ring 78 are approximately 0.4 mm and 1.0 mm, respectively. As in FIG. 1, an optical fiber 92 illuminates mesa 14 while a high voltage is applied across electrodes 78 and 86 by a voltage supply 94.

FIG. 4 shows yet another embodiment in which a N+ layer 96 is ring-shaped beneath a ring-shaped electrode 98 to provide an annular mesa structure. This allows light 100 to directly penetrate into block 12 without first having to penetrate through the N+ layer. This thus allows for a smaller conducting layer in block 12. The elimination of the N+ layer in the center may result in surface breakdown in the center of mesa 14 so that a passivation layer 102 is advantageous. A voltage from a voltage supply 104 is applied across the electrodes as in the other embodiments. As before, this voltage can either be a DC voltage or a pulse voltage with the electrodes being pulsed just prior to the pulsing of the laser.

As will be understood by those familiar with the art, the present invention may be embodied in other specific forms without departing from the spirit or essential characteristics thereof. For example, the electrodes could be shaped as a polygon or another non-ovoid shape. Accordingly, the disclosure of the preferred embodiments of the present invention is intended to be illustrative, but not limiting, of the scope of the invention which is set forth in the following claims.

What is claimed is:

1. A semiconductor switch comprising:
    a block of semiconductor material;
    a mesa of said semiconductor material on a first surface of said block;
    a first conductor coupled to said mesa;
    a second conductor coupled to said block on a second surface opposite said first surface;
    power supply means for providing a high voltage across said conductors; and
    means for irradiating said block with electromagnetic radiation having a predetermined wavelength such that the majority of said radiation penetrates through said block between said contact less than a distance between said first and second surfaces.

2. The switch of claim 1 wherein said mesa structure is circular shape in plan view and has an exposed top surface which covers only a portion of the top surface of said block.

3. The switch of claim 2 wherein said first conductor is in the form of a thin coating covering a portion of the top surface of said mesa, with geometrical coverage factor of the first conductor being between five and ninety-five percent of the exposed area of the top surface of said mesa.

4. The switch of claim 1 wherein at least one of said first conductor and said second conductor is transparent to said electromagnetic radiation.

5. The switch of claim 1 further comprising a first covering layer contiguous to and covering said top surface of said mesa, composed of N+ doped semiconductor material.

6. The switch of claim 5 further comprising a second covering layer contiguous to and substantially covering the bottom surface of said semiconductor block, composed of N+ doped semiconductor material.

7. The switch of claim 5 further comprising a first passivation layer composed of electrically insulating material contiguous to and covering at least a portion of said semiconductor block.

8. The switch of claim 7 further comprising a second passivation layer covering at least a portion of said bottom surface of said semiconductor block.

9. The switch of claim 1 wherein said mesa has the shape of an annulus.

10. The switch of claim 1 wherein said means for irradiating is at least one laser diode.

11. The switch of claim 1 wherein said radiation is monochromatic.

12. A semiconductor switch comprising:
    a block of semiconductor material;
    a circular mesa of said semiconductor material on a first surface of said block;
    a first N+ layer covering at least a portion of a top surface of said mesa;
    a second N+ layer covering at least a portion of a surface of said block opposite said mesa;
    a first electrode coupled to said first N+ layer;
    a second electrode coupled to said second N+ layer;
    a passivation layer covering a portion of said block adjacent said layer;
    power supply means for providing a high voltage across said electrodes; and
    means for irradiating said mesa with electromagnetic radiation having a predetermined wavelength such that a majority of said radiation is absorbed in less than a distance between said electrodes.

13. The switch of claim 1 wherein said mesa structure is ovoid shape in plan view and has an exposed top surface which covers only a portion of the top surface of said block.

14. A semiconductor switch comprising:
- a block of semiconductor material;
- an ovoid mesa of said semiconductor material on a first surface of said block;
- a first N+ layer covering as least a portion of a top surface of said mesa;
- a second N+ layer covering at least a portion of a surface of said block opposite said mesa;
- a first electrode coupled to said first N+ layer;
- a second electrode coupled to said second N+ layer;
- a passivation layer covering a portion of said block adjacent one of said layers;
- power supply means for providing a high voltage across said electrodes; and
- means for irradiating said mesa with electromagnetic radiation having a predetermined wavelength such that a majority of said radiation is absorbed in less than a distance between said electrodes.

* * * * *